United States Patent [19]

Liljeryd

[11] Patent Number: 4,731,852

[45] Date of Patent: Mar. 15, 1988

[54] METHOD TO ELECTRONICALLY CLARIFY SOUND OR PICTURE INFORMATION AND AN ARRANGEMENT TO CARRY OUT THE METHOD

[76] Inventor: Lars G. Liljeryd, 19 Vintervägen, S-171 34 Solna, Sweden

[21] Appl. No.: 870,540

[22] Filed: Jun. 4, 1986

[30] Foreign Application Priority Data

Jun. 4, 1985 [SE] Sweden ............................... 8502762

[51] Int. Cl.$^4$ ............................................... H03G 7/00
[52] U.S. Cl. ......................................... 381/106; 333/14; 307/512; 328/167; 358/36
[58] Field of Search .................. 307/512; 333/14; 328/166, 167; 358/36, 37; 381/106

[56] References Cited

U.S. PATENT DOCUMENTS

| | | | |
|---|---|---|---|
| 2,866,849 | 12/1958 | Lindridge | 381/98 |
| 4,150,253 | 4/1979 | Knoppel | 84/1.19 |
| 4,412,100 | 10/1983 | Orban | 381/106 |
| 4,495,643 | 1/1985 | Orban | 381/106 |
| 4,569,072 | 2/1986 | Van Roermund | 381/13 |
| 4,602,381 | 7/1986 | Cugnini et al. | 381/13 |

FOREIGN PATENT DOCUMENTS 2406863 5/1979 France.

*Primary Examiner*—Forester W. Isen
*Attorney, Agent, or Firm*—Cushman, Darby & Cushman

[57] ABSTRACT

A method for electronically clarifying sound or picture information and an arrangement for carrying out the method. It is previously known to generate harmonics and subharmonics of a useful signal within an audio or video frequency band and to add these to the useful signal in order to improve the perceptibility. Undesirable intermodulation products are generated, however, particularly the difference intermodulation products and the non-linear amplitude ratio between generated harmonic components related to the input signal. The suggested method eliminates substantially all of these undesirable intermodulation products completely and provides a linear amplitude ratio by forming two orthogonal components ($X_S, X_C$) from the useful signal ($X$), compressing one or both of these components and multiplying the result to form the harmonics ($2f_1, 2f_2$) which are thereafter mixed with the useful signal.

12 Claims, 9 Drawing Figures

METHOD TO ELECTRONICALLY CLARIFY SOUND OR PICTURE INFORMATION AND AN ARRANGEMENT TO CARRY OUT THE METHOD

TECHNICAL FIELD

This invention relates to a method for electronically clarifying sound or picture information represented by a complex signal containing at least two frequency components within an audio or video frequency band, for example, the harmonics of the frequency components being generated from the useful signal. Moreover, the present invention includes, a circuit arrangement for carrying out the method and is intended to be especially used to provide a spectrum of output signals having a substantially linear amplitude characteristic, the output signals being mixed with the program material for improved perceptibility.

DESCRIPTION OF THE PRIOR ART

It is known to influence the perceptibility of an audio signal by adding a special form of distortion to the audio signal, the distortion consisting of combinations of harmonics and subharmonics having a dynamically nonlinear amplitude ratio related to the input signal. Examples of previously known devices for this purpose are shown in U.S. Pat. Nos. 4,150,253, 2,866,849 as well as French Pat. No. 2,406,863.

U.S. Pat. No. 4,150,253 describes a device connected to an audio source where the signal in the device is divided into two signal paths. In one signal path the electric signals are forwarded without being treated. In the other path distortion products are created by unsymmetrical clipping, i.e., harmonics and subharmonics from the incoming signal and the amplitudes of the generated harmonic components are unlinearly related in respect of amplitude. These harmonic components, the amplitudes of which are attenuated above a certain level in a limiter, obtain a level lower than that of the signal in the first signal path. By mixing the signals thus generated in the second signal path with the unchanged signal in the first signal path, an output signal is obtained which is intended to represent an improved audio signal with better perceptibility. It is also known to increase the derivative of a video or luminance signal by means of another similar method through differentiation in order to try to increase the picture definition, e.g., of a TV-receiver in this way. As this also implies a nonlinear generation of undesirable intermodulation products, however, the method only results in a partial improvement of the definition because certain picture elements are also impaired.

SUMMARY OF THE INVENTION

In the above-mentioned U.S. Pat. No. 4,150,253 it is desired to provide an improvement of the perceptibility by mixing distortion products created from the original audio signal with this signal. However, this known device does not consider the non-desired difference intermodulation products (subharmonics) arising when the distortion is generated. Nor is the non-linear amplitude relationship between generated harmonic components with respect to the input signal considered.

In such a system, the generation of harmonics of the original signal by squaring of the original signal containing the frequencies $f_1$ and $f_2$ ($f_2 > f_1$) causes the products $2f_1$, $2f_2$, $f_1 + f_2$ and $f_2 - f_1$ to be obtained. The difference modulation product $f_2 - f_1$ (which is a subharmonic) is not harmonically related to the original signal. Therefore, this subharmonic sounds very bad and contributes, to a poorer perceptibility (coarser picture elements are generated at video reproduction).

According to the invention this subharmonic component is eliminated by adding a signal to the squaring multiplier which shifts the phase of the signal 90° by means of a phase difference network before the signal is supplied to the inputs of the multiplier. In order to compensate for the quadratic amplitude expansion obtained at squaring, the inventive arrangement also comprises an amplitude compressing circuit which compresses the signal by the inverse value of the amplitude expansion obtained by squaring, i.e., by the square root of the amplitude value of the signal.

It is thus the object of the invention to provide a method and a circuit arrangement for clarifying sound and picture information, which circuit, upon clarifying, eliminates undesirable intermodulation products, whereby substantially only harmonics are created. Moreover, the resulting harmonic spectrum is generated with a substantially equivalent dynamic ratio related to the input signal.

BRIEF DESCRIPTION OF DRAWINGS

The invention will be described in greater detail with reference to the appended drawings wherein.

DETAILED DESCRIPTION OF THE PREFERRED EMBODIMENTS

Figure 1:
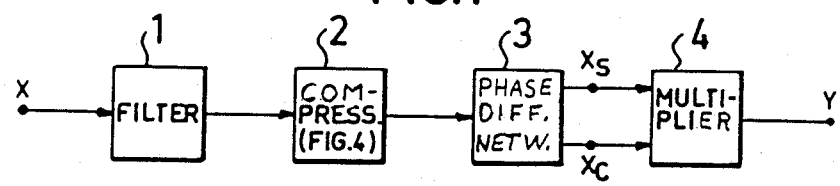
FIG. 1 shows a block diagram of an embodiment of a circuit arrangement for carrying out the method of the invention.

FIG. 1 shows a block diagram of an electronic circuit arrangement for carrying out the method of the invention and is not considered to be restricted to the case when mixture with the program material takes place. An input signal X represents the useful signal (i.e., the program material) and this signal contains a number of frequencies $f_1, f_2, \ldots f_n$, the harmonics of which are to be generated in such a way that they are substantially linearly related to the useful signal X. The signal X can, for example, contain audio information, the audibility of which is to be improved.

The signal path shown in FIG. 1 contains a filter 1, preferably with a bandpass characteristic in order to determine the frequency range within which treatment of the components having the frequencies $f_1, f_2 \ldots f_n$ of the signal is carried out, i.e., the frequencies $f_1, f_2, \ldots f_n$ should all be situated within the passband of the filter 1.

The filter 1 is connected to an amplitude compressor 2, the object of which is to compress the signal obtained from the filter 1 according to a certain characteristic. This is accomplished by compensating for the expansion obtained by the signal X in the multiplier 4 described below. More specifically, the compressor 2 performs a compression of the signal X equal to the inverse of the expansion of the signal obtained in the multiplier 4. It is then suitable to place the compressor 1 before the multiplier 4 in the signal path according to FIG. 1, since clipping the signal in a following multiplier 4 then is avoided. In connection with FIG. 4 the compressor 2 will be described in greater detail in the embodiment of the arrangement of the invention shown in FIG. 1.

The phase difference network 3 connected to the output of the compressor 2 divides the incoming signal containing the frequencies $f_1, f_2, \ldots f_n$ (but now with a compressed amplitude) into two components $X_S$ and $X_C$ which appear across the two outputs of the network 3. These components are mutually phase shifted 90° for all frequencies $f_1, f_2 \ldots f_n$ of interest. The network 3 can for example be of a design shown in the article in IEEE Transaction on Circuit Theory, vol. CT-16, No. 2, May 1969, or according to an article in "Electronics", Aug. 21, 1975, pages 82–85.

The multiplier 4 is of a known type and is connected to the two outputs of the phase difference network 3 for multiplying the two output signals $X_S$ and $X_C$. As a result, an output signal Y is obtained from the multiplier which contains the harmonics $2f_1, 2f_2, \ldots 2f_n$ as well as sum intermodulation products $f_1+f_2, f_1+f_3, \ldots f_2+f_3, \ldots$, but no difference intermodulation products $f_2-f_1$, $f_3-f_1, \ldots$ If the output signals $X_S$ and $X_C$ from the phase difference network 3 are $X_s = A_1 \sin \alpha + A_2 \sin \beta$ and $X_c = A_1 \cos \alpha + A_2 \cos \beta$, the following is obtained after multiplication in the multiplier 4:

$$Y = X_s \cdot X_c = A_1^2/2 \sin \alpha + A_2^2/2 \sin 2\beta + A_2^2/2 \sin (\alpha + \beta) \cdot \sin 2\beta.$$

In the case where $\sin \alpha$ and $\sin \beta$ are, for example, signal components of the same signal but with mutually different amplitudes following upon each other, i.e., $A_2 = k \cdot A_1$ where $k$=a constant, the following is obtained:

$$Y = A_1^2/2 \cdot \sin 2\alpha + k \cdot A_1^2 \sin (\alpha + \beta) k_2 \cdot A_1^2/2 \sin 2\beta.$$

An exponential increase of the output signal Y is thus obtained when the input signal X is increased linearly. In order to compensate for this exponential function, the compressor 2 is connected as shown. This is so slow that it only reacts on the envelope (i.e. the amplitudes) of the signals included. Thus, it acts to extract the root of the total amplitude of the input signal X. If, according to the above, $A_2 = k \cdot A_1$ and the total amplitude of the input signal is $A_1 + A_2 = A_1 (1+k)$, after the compressor, the amplitude $\sqrt{A_1(1+k)}$ is obtained. The ratio between the amplitudes of the harmonics is the same after the compressor, i.e., $A_{2e} = k \cdot A_{1e}$ ($A_{1e}, A_{2e}$=the respective amplitudes after the compressor). Thus $\sqrt{A_1(1+k)} = A_{1e}(1+k)$ resulting in that $A_{1e} = \sqrt{A_1} \cdot \frac{1}{\sqrt{1+k}}$ and $A_{2e} = \sqrt{A_1 1} \cdot \frac{k}{\sqrt{1+k}} = \sqrt{A_2} \cdot \sqrt{1+k}$, i.e., since $Y = \frac{1}{2}(A_{1e})^2 \cdot \sin 2\alpha + A_{1e} \cdot A_{2e} \sin (\alpha + \beta) + \frac{1}{2}(A_{2e})^2 \sin 2\beta$, Y will be $= A_1/2(1-k) \cdot \sin 2\alpha + (k \cdot 1)/(1+k) \sin (\alpha + \beta) + (-k^2 A_1)/2(1+k) \sin 2\beta$.

A linear increase of the amplitudes $A_1, A_2$ of the input signal diagram provides a linear increase of the harmonics of the output signal.

Figure 2:
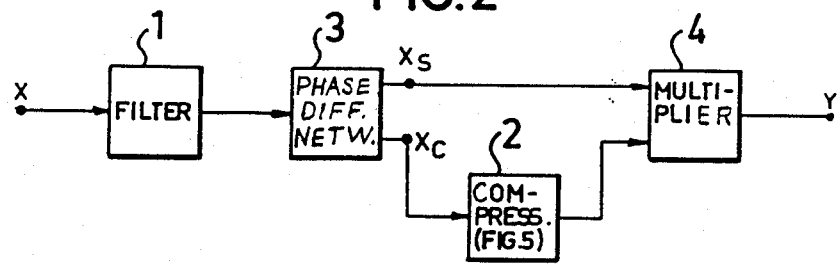
FIG. 2 shows a block diagram of another embodiment of the circuit arrangement for carrying out the method of the invention.
Figure 3:
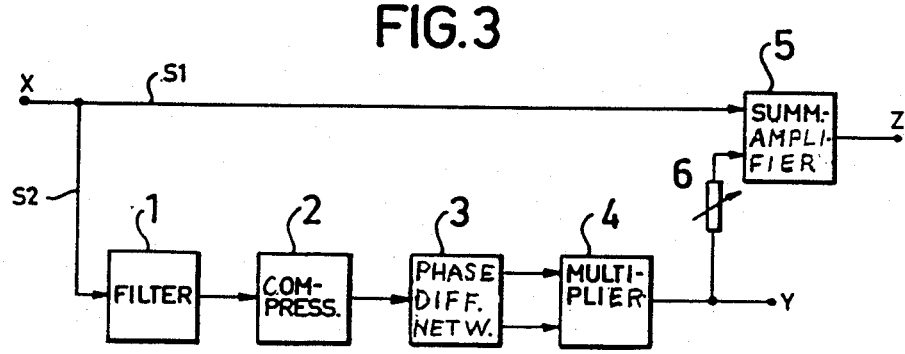
FIG. 3 shows a block diagram in which the circuit arrangement for carrying out the method of the invention is connected in a side path according to a previously known embodiment.

FIG. 2 shows a block diagram of another embodiment of the device for carrying out the method of the invention. The same reference numerals as in FIG. 1 have been maintained to indicate the corresponding units. In this embodiment the phase difference network 3 has been connected to the output of the filter 1, and the compressor 2 has been connected to the output of the phase difference network across which the signal $X_C$ appears. In this case the compressor comprises a circuit giving a constant output level to the following multiplier 4 of the component $X_C$ independently of the input level of $X_C$. Like in known devices the circuit device according to FIGS. 1 or 2 can be connected to a side path for mixture with the original useful signal X. FIG. 3 shows an example when the device according to FIG. 1 is connected in this way. One signal path s1 leads the audio signal being uninfluenced to one input of a summing amplifier 5. The other input of the amplifier 5 receives the output signal Y from the second signal path S2. A potentiometer 6 is connected between the output of the multiplier 4 and the second input of the amplifier 5. By means of the potentiometer 6 it is thus possible to select a quantity of a harmonic spectrum generated in the signal path S2 to be mixed with the program material.

Figure 4:
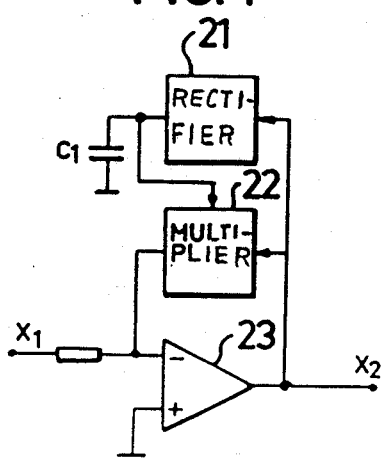
FIG. 4 shows a circuit diagram of a possible embodiment of a compressing circuit included in the embodiment according to FIG. 1.

FIG. 4 shows more closely the appearance of the compressor 4 used in the device according to FIG. 1. A multiplier 22, the input signal of which is the output signal of operational amplifier 23, is connected in a negative feedback loop to the operational amplifier 23 with an earthed positive input. The input signal of the compressor 4, i.e., the output signal from the filter 1, is supplied to the negative input of the operation amplifier as well as the output signal from the multiplier 22. A rectifier 21, e.g., a full wave rectifier, connected to the output of the operational amplifier 23 gives a DC-signal proportional, e.g., to the mean value of the output signal from the operational amplifier 23. This signal is then supplied as a control signal to the multiplier 22. In this way a compression of the signal $X_1$ coming to the compressor is obtained and gives the output signal $X_2$, $X_2$ being equal to the square root of the amplitude of the signal $X_1$. In this way a compensation of the square amplitude expansion in the multiplier 4 according to FIG. 1 is obtained.

Figure 5:
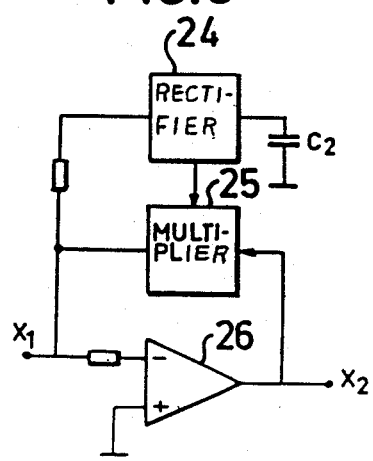
FIG. 5 shows the circuit diagram of a compressing circuit included in the embodiment of FIG. 2.

FIG. 5 shows another embodiment of the compressor 2 which is used in the embodiment according to FIG. 2. The compressor 2 is here made as a circuit which gives an output signal $X_2$ having a constant level independently of the level of the input signal $X_1(X_2 \approx X_1)$. Like in the embodiment according to FIG. 4, the compressor according to FIG. 5 consists of an operational amplifier 26, a controllable multiplier 25 and a rectifier 24. The rectifier is here connected to the input $X_1$ and gives a DC-signal proportional, e.g., to the mean value of the input signal. This is supplied as a control signal to one input of the multiplier 25. In this way an amplification is obtained in the compressor which is inversely proportional to the amplitude of the input signal $X_1$, i.e., a decrease of 20 dB in the input level gives an amplification increase of 20 dB. The result of this is that this compressor always gives a constant output signal ($X_2$) for a varying input signal ($X_1$). As the multiplier 4 in FIG. 2 obtains a linearly varying input signal on one input and the same signal phase shifted by 90° at a constant amplitude on the other input, the multiplier produces an output signal $X_2$ which is linearly related to the amplitude of the input signal $X_1$.

Figure 6:
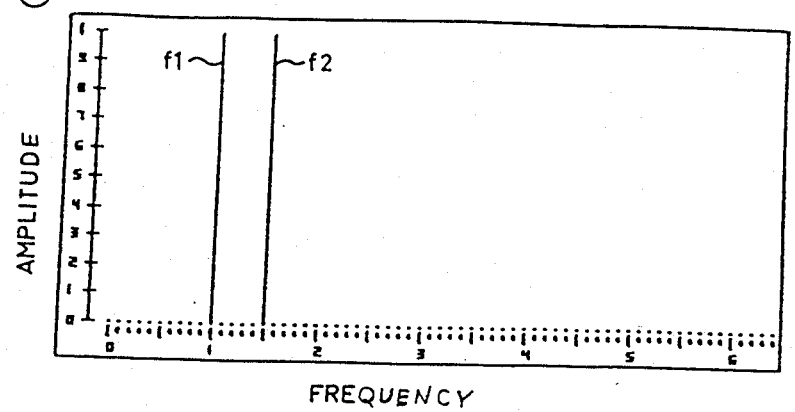
FIGS. 6–9 show a diagram of frequency amplitudes.

FIG. 6 shows a Fourier analysis of the frequency spectrum of a periodic test signal X which has been supplied to the respective arrangements according to the invention and known devices according to what is stated below. The signal X contains the two frequencies $f_1$ and $f_2$, which are, for example, 1 kHz and 1.5 kHz, respectively.

Figure 7:
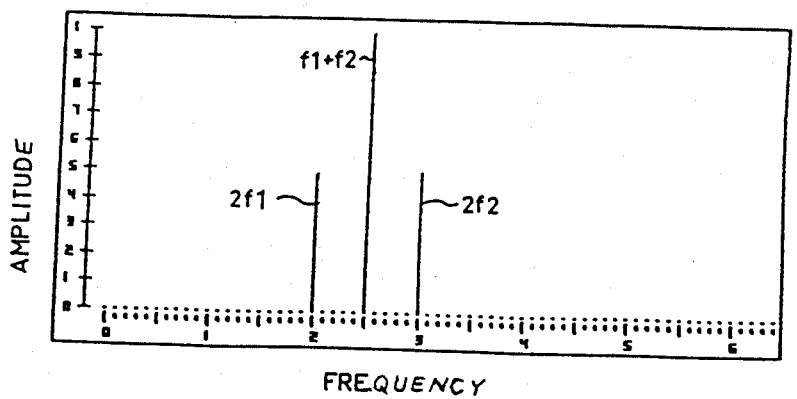

FIG. 7 shows by Fourier analysis the output signal Y from the device according to FIGS. 1 and 2 when the test signal X is supplied as the input signal. The two harmonics $2f_1$, $2f_2$ as well as the sum intermodulation product $f_1+f_2$ are obtained.

Figure 8:
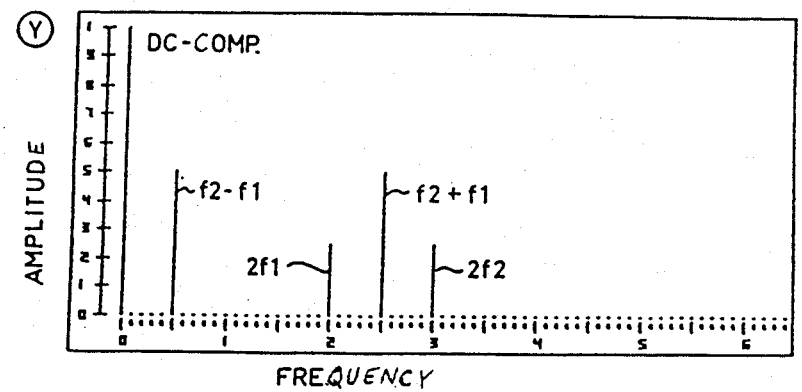
Figure 9:
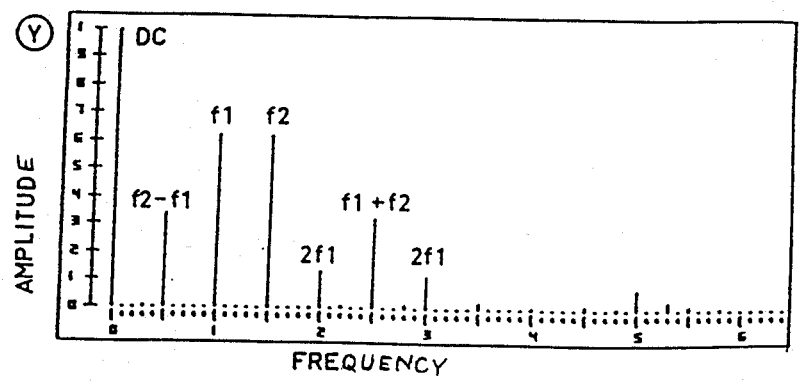

FIGS. 8 and 9 show by Fourier analysis an approximative output signal with the test signal X according to FIG. 6 as an input signal for the two known devices according to French Pat. No. 2,406,863 and U.S. Pat. No. 4,150,253. As is seen the difference intermodulation product $f_2-f_1$ is also obtained in addition to a DC-component which product influences the perceptibility negatively when the output signal Y is mixed with the useful signal X.

Of course the method and device described here can be carried out discretely digitally or can be implemented in software for a fast signal processor.

At present the analog embodiment has a considerably better price-performance ratio. In certain applications where a great precision is required a hybrid circuit solution combining analog and digital techniques may be suitable. The multiplier can, e.g., be replaced by two multiplying D/A-converters connected for squaring the output of one D/A-converter connected to the reference input of the other D/A-converter. This solution will be considerably cheaper than when a digital multiplier with a D/A-converter is used. Of course, the audio signal must be digitalized in these cases.

What I claim is:

1. A method for electronically clarifying sound or picture information represented by an input signal X which contains at least two respective frequency components, comprising the steps of:
   amplitude compressing said input signal X according to a first characteristic;
   dividing the amplitude compressed signal into two orthogonal components $X_s$ and $X_c$; and
   multiplying the two orthogonal components $X_s$ and $X_c$ in a multiplier having a second characteristic inverse to said first characteristic to obtain an output signal Y which contains the harmonics of said respective frequency components as well as sum intermodulation products of said respective frequency components, difference intermodulation products of said respective frequency components being eliminated so that the harmonics of said output signal Y have a substantially equivalent dynamic amplitude ratio with respect to the input signal X.

2. The method of claim 1, comprising the further step of:
   mixing said output signal Y with said input signal X in a summing amplifier.

3. The method of claim 1, comprising the further step of:
   bandpass filtering said input signal X before it is amplitude compressed.

4. A method for electronically clarifying sound or picture information represented by an input signal X which contains at least two respective frequency components, comprising the steps of:
   dividing said input signal X into two orthogonal components $X_s$ and $X_c$;
   amplitude compressing one of said orthogonal components $X_s$ and $X_c$ according to a first characteristic; and
   multiplying said one compressed orthogonal component by the other non-compressed orthogonal component in a multiplier having a second characteristic inverse to said first characteristic to obtain an output signal Y which contains the harmonics of said respective frequency components as well as sum intermodulation products of said respective frequency components, difference intermodulation products of said respective frequency components being eliminated so that the harmonics of said output signal Y have a substantially equivalent dynamic amplitude ratio with respect to the input signal X.

5. The method of claim 4, comprising the further step of:
   mixing said output signal Y with said input signal X in a summing amplifier.

6. The method of claim 4, comprising the further step of:
   bandpass filtering said input signal X before it is divided.

7. A device for electronically clarifying sound or picture information represented by an input signal X which contains at least two respective frequency components within a selected frequency band, comprising:
   means for dividing said input signal X into two mutually phase-shifted components $X_s$ and $X_c$;
   means for multiplying said mutually phase-shifted components $X_s$ and $X_c$ to produce an expanded output signal Y, said multiplying means having a first signal characteristic; and
   means for compensating the amplitude expansion of the multiplied components $X_s$ and $X_c$ and for eliminating a difference intermodulation product, said compensating means having a second signal characteristic inverse to said first characteristic and connected such that harmonics generated by said multiplying means have a substantially equivalent dynamic amplitude ratio with respect to the input signal X.

8. A device as claimed in claim 7, wherein said compensating means comprises an amplitude compressing circuit including an operational amplifier which receives an input signal at a negative input, a multiplier and a rectifier, said multiplier receiving the output of said operational amplifier and connected in a negative feedback loop to the negative input of said operational amplifier, and said rectifier providing a DC signal for controlling said multiplier.

9. A device as claimed in claim 7, further comprising a bandpass filter for bandpass filter said input signal X over said selected frequency band.

10. A device as claimed in claim 7, wherein said compensating means amplitude compresses said input signal X and said amplitude compressed input signal is inputted to said dividing means, said phase-shifted components $X_s$ and $X_c$ being provided at respective outputs of said dividing means and being applied as respective inputs to said multiplying means.

11. A device as claimed in claim 7, wherein said compensating means amplitude compresses one of said phase-shifted components outputted by said dividing means, said amplitude compressed component and the component not compressed being applied as respective inputs to said multiplying means.

12. A device as claimed in claim 7, further comprising a summator with its inputs respectively receiving said input signal X and said output signal Y.

* * * * *